(12) United States Patent
Ortega Gutierrez et al.

(10) Patent No.: US 12,250,791 B2
(45) Date of Patent: Mar. 11, 2025

(54) SYSTEMS AND METHODS FOR RECOVERING FLUID IN IMMERSION-COOLED DATACENTERS

(71) Applicant: Microsoft Technology Licensing, LLC, Redmond, WA (US)

(72) Inventors: Felipe Enrique Ortega Gutierrez, Tacoma, WA (US); Osvaldo P. Morales, Normandy Park, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 133 days.

(21) Appl. No.: 17/534,868

(22) Filed: Nov. 24, 2021

(65) Prior Publication Data

US 2023/0164952 A1    May 25, 2023

(51) Int. Cl.
H05K 7/20    (2006.01)

(52) U.S. Cl.
CPC ......... *H05K 7/203* (2013.01); *H05K 7/20318* (2013.01); *H05K 7/20327* (2013.01)

(58) Field of Classification Search
CPC ........... H05K 7/20818; H05K 7/20327; H05K 7/20318; H05K 7/203
See application file for complete search history.

(56) References Cited

U.S. PATENT DOCUMENTS

| | | | |
|---|---|---|---|
| 4,731,154 A * | 3/1988 | Hausman Hazlitt ... | G01N 21/94 216/85 |
| 9,345,170 B2 * | 5/2016 | Ishikawa ................ | G01M 3/04 |
| 9,433,132 B2 * | 8/2016 | Krishnan ............ | H05K 7/20818 |
| 9,696,235 B2 * | 7/2017 | Alshinnawi .......... | F24F 11/0001 |
| 10,660,239 B2 | 5/2020 | Edwards et al. | |
| 10,770,317 B2 | 9/2020 | Tustaniwskyj | |
| 10,916,818 B2 * | 2/2021 | Gao .................... | H05K 7/20309 |
| 10,966,353 B2 | 3/2021 | Wang | |
| 11,026,351 B2 | 6/2021 | Kulkarni et al. | |
| 11,044,834 B1 * | 6/2021 | Lau ..................... | H05K 7/20272 |
| 2016/0120059 A1 * | 4/2016 | Shedd ..................... | F28D 21/00 165/244 |
| 2020/0093038 A1 * | 3/2020 | Enright .............. | H05K 7/20318 |
| 2020/0238570 A1 * | 7/2020 | Rikiishi .............. | H01L 21/3043 |

(Continued)

FOREIGN PATENT DOCUMENTS

| CN | 206674401 U | 11/2017 |
|---|---|---|
| CN | 106455433 B | 2/2019 |

(Continued)

OTHER PUBLICATIONS

"International Search Report and Written Opinion Issued in PCT Application No. PCT/US22/043572", Mailed Date: Dec. 19, 2022, 11 Pages.

(Continued)

*Primary Examiner* — Jacob R Crum
*Assistant Examiner* — Matthew Sinclair Muir
(74) *Attorney, Agent, or Firm* — RAY QUINNEY & NEBEKER P.C.; Paul N. Taylor

(57) ABSTRACT

An immersion cooling system includes a catch pan, a heat-generating electronic device, a housing, and a fluid pump. The housing is positioned around the heat-generating electronic device, and at least part of the housing is positioned above the catch pan. The fluid pump is configured to circulate a working fluid from the catch pan to the housing.

20 Claims, 3 Drawing Sheets

(56) References Cited

U.S. PATENT DOCUMENTS

| | | | | |
|---|---|---|---|---|
| 2022/0408599 A1* | 12/2022 | Gao | ............... | H05K 7/20818 |
| 2023/0080447 A1* | 3/2023 | Shah | ............... | H05K 7/20836 |
| | | | | 361/679.53 |
| 2023/0091814 A1* | 3/2023 | Gordon | ............. | H05K 7/20772 |
| | | | | 165/80.4 |
| 2023/0413482 A1* | 12/2023 | Kohara | ............. | H05K 7/20936 |

FOREIGN PATENT DOCUMENTS

| | | |
|---|---|---|
| CN | 112013692 A | 12/2020 |
| DE | 102015111055 A1 | 2/2016 |

OTHER PUBLICATIONS

Berktold, et al., "Leak Detection and Intervention", In Open Compute Project, 2020, 46 Pages.

* cited by examiner

SYSTEMS AND METHODS FOR RECOVERING FLUID IN IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid working fluids have more thermal mass than air or gas cooling. The liquid working fluid can be maintained at a lower temperature by allowing vaporized fluid to rise out of the liquid. The vapor in the cooling liquid can adversely affect the cooling performance of the working fluid. The vapor can be condensed and returned to the immersion tank.

BRIEF SUMMARY

In some embodiments, an immersion cooling system includes a catch pan, a heat-generating electronic device, a housing, and a fluid pump. The housing is positioned around the heat-generating electronic device, and at least part of the housing is positioned above the catch pan. The fluid pump is configured to circulate a working fluid from the catch pan to the housing.

In some embodiments, an immersion cooling system includes a catch pan, a heat-generating electronic device, a housing, a fluid reservoir, and a fluid pump. The housing is positioned around the heat-generating electronic device, and at least part of the housing is positioned above the catch pan. The fluid reservoir is in fluid communication with the housing and configured to provide working fluid to the housing. The fluid pump is configured to circulate the working fluid from the catch pan to the fluid reservoir.

In some embodiments, an immersion cooling system includes a catch pan, a heat-generating electronic device, a housing, a fluid reservoir, a fluid pump, and a level sensor. The housing is positioned around the heat-generating electronic device, and at least part of the housing is positioned above the catch pan. The fluid reservoir is in fluid communication with the housing and configured to provide working fluid to the housing. The fluid pump is configured to circulate the working fluid from the catch pan to the fluid reservoir. The level sensor is positioned in the catch pan and in data communication with the fluid pump.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for thermal management of electronic devices or other heat-generating components Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber.

In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid. Fluid conduits include closed tubes or pipes, such as metal pipes, plastic pipes, or flexible pipes. Fluid conduits also include open conduits, such as troughs, funnels, spillways, spouts, nozzles, or other open structures configured to direct fluid flow.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system.

Figure 1:
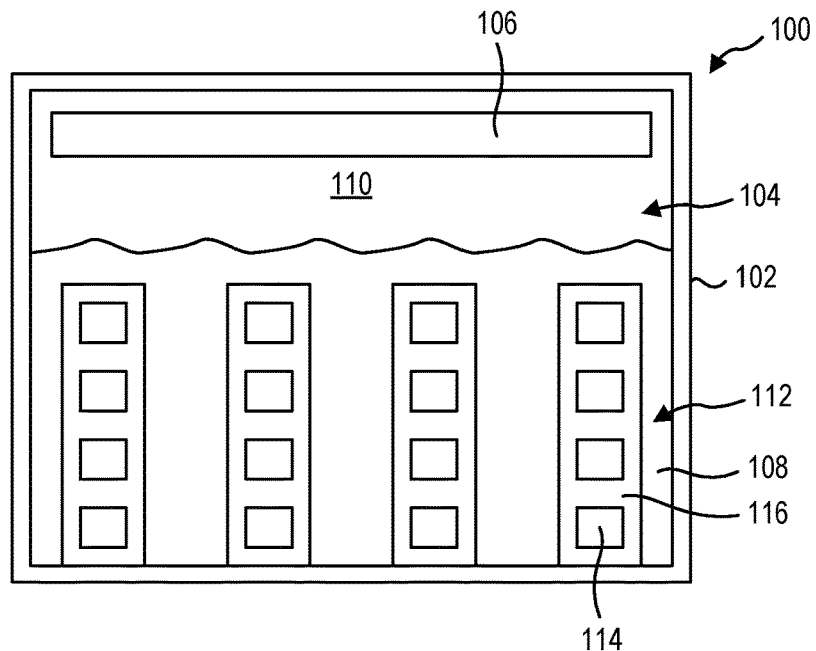
FIG. 1 is a side schematic representation of an immersion cooling system, according to at least one embodiment of the present disclosure.

A conventional immersion cooling system 100, shown in FIG. 1, includes an immersion tank 102 containing an immersion chamber 104 and a condenser 106 in the immersion chamber 104. The immersion chamber 104 contains a working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
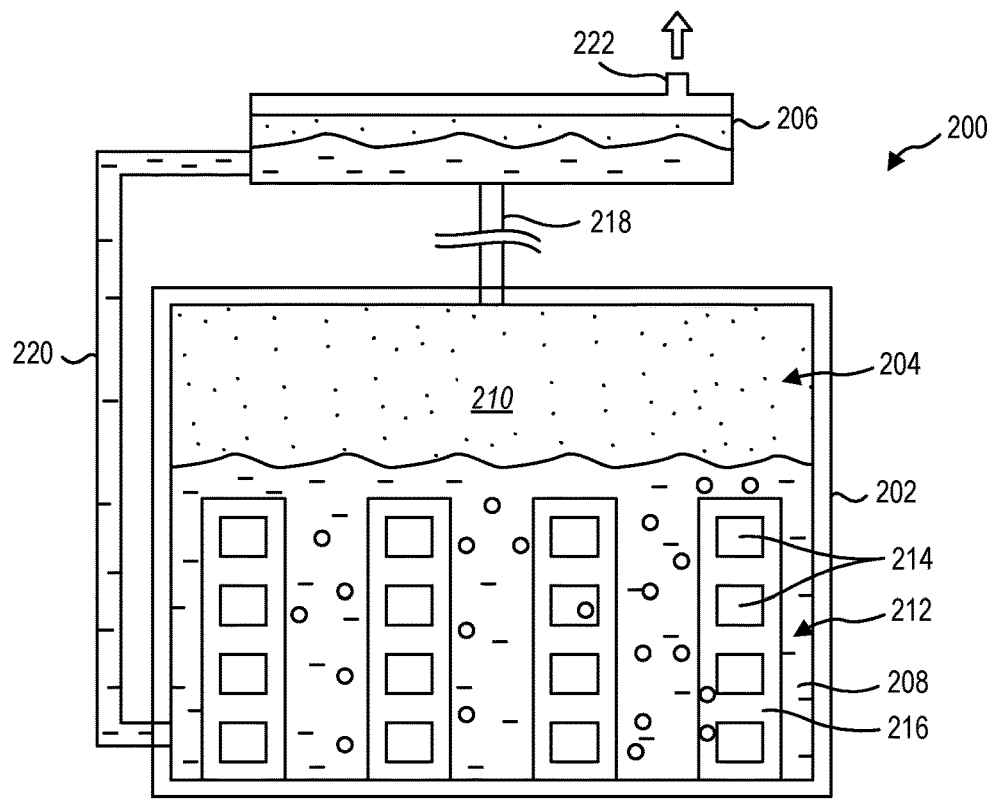
FIG. 2 is a side schematic representation of an immersion cooling system with an external condenser, according to at least one embodiment of the present disclosure.

Referring now to FIG. 2, an immersion cooling system 200 according to the present disclosure includes an immersion tank 202 defining an immersion chamber 204 with a working fluid positioned therein. The working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computers or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat-generating components 214 include an electric motor.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiently remove the thermal energy from the working fluid. In some embodiments according to the present disclosure, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air.

Figure 3:
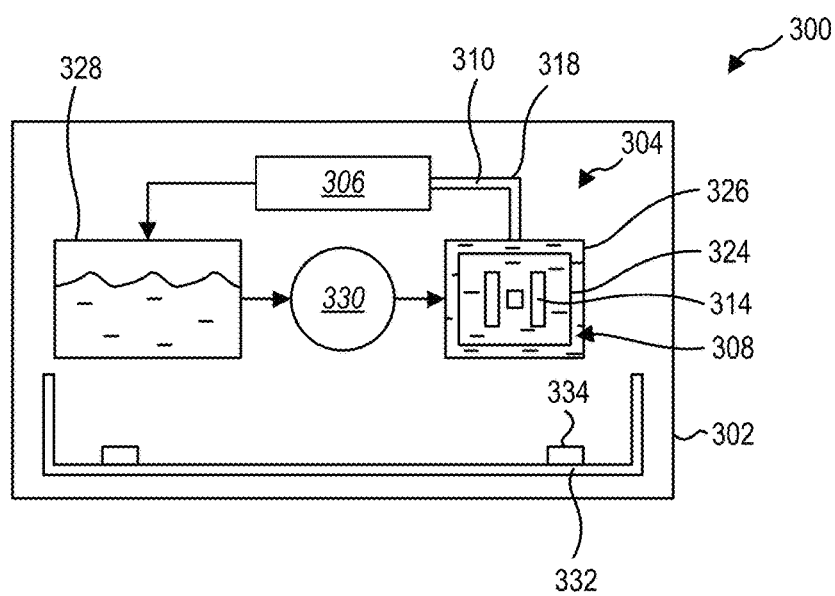
FIG. 3 is a side schematic representation of an immersion cooling system with an internal condenser and a catch pan, according to at least one embodiment of the present disclosure.

FIG. 3 is a schematic representation of an immersion cooling system 300 with localized immersion chambers 304 around a server computer 324 to capture and pool liquid working fluid 308 adjacent the greatest heat-generating components 314. Working fluid is recycled through the thermal management system, and, in some embodiments, the working fluid is a dielectric fluid or other fluid that is expensive. A thermal management system that uses less working fluid and/or uses the working fluid more efficiently allows for cost savings in the working fluid. In some embodiments, the working fluid is relatively dense and containing large volumes of the working fluid requires a strong container. Building and maintaining containers for large volumes and/or masses of working fluid can increase construction costs and container weight, which limits transport and maintenance of the containers.

In a conventional immersion tank, the liquid pressure increases as depth of the immersion bath increases. In conventional tanks and fluids, a depth of 1 meter results in a 2.3 pounds per square inch (PSI) increase. The increased pressure results in an increase in the boiling point for the working fluid and a resulting temperature increase of the components adjacent the working fluid at the bottom of the immersion bath. When separate immersion chambers are placed around heat-generating components, and/or the boards are oriented horizontally, the columnar pressure of the fluid around the component is reduced and produces lower operating temperatures for the component. In at least one example, a working fluid exhibits a 4° C. decrease in temperature relative to a component at a depth of 1 meter in a conventional immersion tank.

As the working fluid carries away thermal energy through latent heat of boiling, managing the boiling temperature of the working fluid is beneficial for the performance of the immersion cooling system. In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

In some embodiments according to the present disclosure, a housing 326 is positioned around or on a server computer 324 or other electronic device to capture the liquid working fluid 308 adjacent to at least one heat-generating component 314 of the server computer 324 in an immersion chamber 304. In some embodiments, the housing 326 includes a stamped metal or polymer sheet. In some embodiments, the housing 326 includes an injection molded sheet. The housing 326 may have planar or curved surfaces to define a portion of the immersion chamber 304. In some embodiments, the housing 326 defines a portion of a rectangular prism or box-shaped immersion chamber 304 around the heat-generating electronic components 314. In some embodiments, at least a portion of the housing 326 is contoured to follow the shape of the heat-generating electronic components 314.

The housing 326 allows for the immersion cooling system 300 to use less working fluid than a conventional immersion cooling system in which the entire tank 302 is filled with working fluid into which the heat-generating components 314 are immersed. The housing 326 contains the liquid working fluid 308 around the heat-generating components, and, when the liquid working fluid 308 vaporizes, the vapor working fluid 310 passes through a vapor return line 318 to the condenser 306. In single-phase cooling systems, the condenser 306 may be a heat exchanger or radiator to cool hot liquid working fluid 308 cycled out of the housing 326.

The liquid working fluid 308 is stored in a fluid reservoir 328 from which a fluid pump 330 may draw or push the liquid working fluid 308 to the immersion chamber 304 contained in the housing 326. In some embodiments, a portion of the liquid working fluid 308 may leak from the housing 326, fluid reservoir 328, or other fluid conduits of the thermal management system. In some embodiments, a portion of the liquid working fluid 308 may leak from the housing 326, fluid reservoir 328, or other fluid conduits of the thermal management system as incoming liquid working fluid 308 flows into the immersion chamber 304 from the pump 330. In some embodiments, a portion of the liquid working fluid 308 may leak from the housing 326, fluid reservoir 328, or other fluid conduits of the thermal management system as the vapor working fluid 310 returns from the immersion chamber 304. In conventional thermal management systems, a catch pan 332 is positioned under the housing 326, fluid reservoir 328, condenser 306 (or heat exchanger) or other fluid conduits of the thermal management system to capture the leaked working fluid. A leak sensor 334 may indicate to a technician when a leak has occurred.

The leaked working fluid is lost to the system, and, in the case of persistent leak, the housing 326, fluid reservoir 328, condenser 306 (or heat exchanger) or other fluid conduits of the thermal management system may substantially empty of working fluid, preventing effective thermal management of the server computer 324 or other heat-generating components 314. In some examples, a portion of the working fluid is lost to the system, and the air in the housing 326, fluid reservoir 328, condenser 306 (or heat exchanger) or other fluid conduits of the thermal management system may cause intermittent delivery of liquid working fluid 308, resulting in a water hammer effect that may damage the server computer 324 or other heat-generating components 314. By opening at least a portion of the working fluid circulation system, such as a catch pan 332 or fluid reservoir 328, to ambient atmosphere (inside the tank 302 or outside the tank 302), an immersion cooling system according to the present disclosure may limit and/or prevent the water hammer effect.

Figure 4:
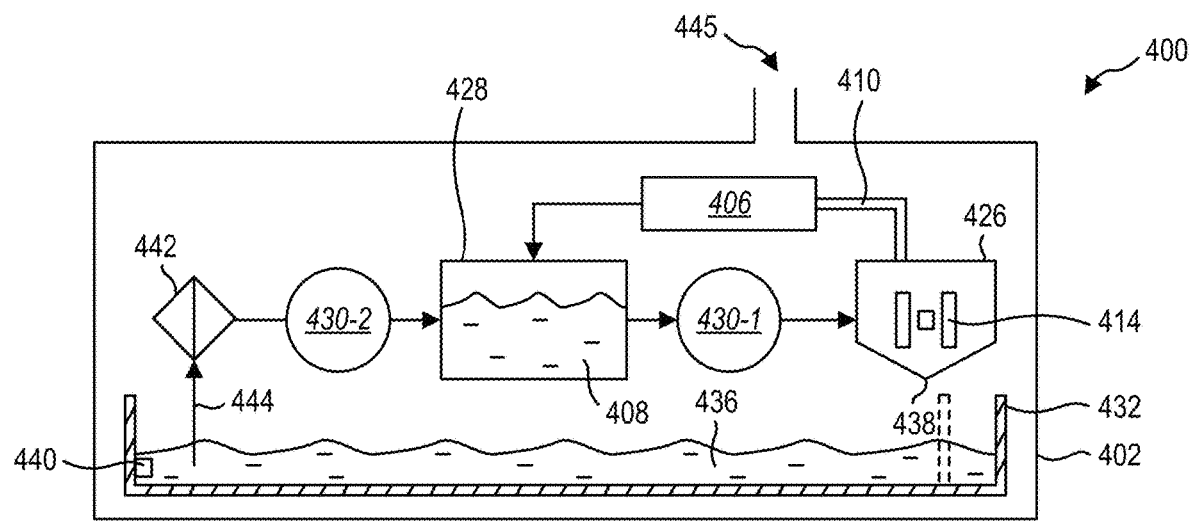
FIG. 4 is a side schematic representation of an immersion cooling system configured to recirculate leaked working fluid from a catch pan, according to at least one embodiment of the present disclosure.

FIG. 4 illustrates an example of an immersion cooling system 400 that allows at least a portion of the leaked working fluid to be reintroduced to the fluid reservoir or other portions of the immersion cooling system 400 to extend the effective cooling capability of the immersion cooling system 400. By reintroducing the leaked working fluid 436 to the system, technicians may have more time to respond to a leak before the immersion cooling system 400 runs dry and the heat-generating components 414 lack thermal management.

In some embodiments, any or all of the fluid reservoir 428, condenser 406, fluid pump 430-1, housing 426, and fluid conduits therebetween are positioned above the catch pan 432. In some embodiments, a component of the immersion cooling system 400 is positioned above the catch pan 432 when the entire component is located above the catch pan 432 in the direction of gravity or a drip point of the component is located above the catch pan 432 in the direction of gravity. In some embodiments, a component of the immersion cooling system 400 is positioned above the catch pan 432 when at least 75% of the component is located above the catch pan 432 in the direction of gravity or a drip point of the component is located above the catch pan 432 in the direction of gravity. In some embodiments, a component of the immersion cooling system 400 is positioned above the catch pan 432 when at least 50% of the component is located above the catch pan 432 in the direction of gravity or a drip point of the component is located above the catch pan 432 in the direction of gravity. For example, a housing 426 (or other component) is positioned above the catch pan 432 when the entire housing 426 is located above the catch pan 432 such that any leaked working fluid 436 that drips from any portion of the housing 426 falls directly into the catch pan 432 under the influence of gravity.

In some examples, a housing 426 (or other component) is positioned above the catch pan 432 when a drip point 438 of the housing 426 is above the catch pan 432 such that any leaked working fluid 436 that leaks from the housing 426 is guided, such as by cohesion, to the drip point 438 and, subsequently, falls directly into the catch pan 432 under the influence of gravity. In the embodiment illustrated in FIG. 4, a single catch pan 432 is located under all of the other components of the immersion cooling system 400, however, it should be understood that multiple catch pans 432 may be used to catch leaks from any number of components of the immersion cooling system 400.

The catch pan 432 may include a level sensor 440 that measures includes a pressure or electrical contact that determines when leaked working fluid 436 is present in the catch pan 432. The level sensor 440 can determine a fluid level of the leaked working fluid 436 and communicate with one or more components of the immersion cooling system 400 or other systems. For example, the level sensor 440 may be in electrical or data communication with a second fluid pump 430-2. In response to the level sensor 440 detecting the presence of leaked working fluid 436 at a high enough level in the catch pan 432, the second fluid pump 430-2 may pump the leaked working fluid 436 to the fluid reservoir 428. In some embodiments, a fluid filter 442 may be positioned before and/or after the second fluid pump 430-2 to clean the leaked working fluid 436 before the leaked working fluid 436 returns to the fluid reservoir 428 and mixes with the liquid working fluid 408 therein. In some embodiments, the second fluid pump 430-2 draws the leaked working fluid 436 from the catch pan 432 proximate the level sensor 440, such that the second fluid pump 430-2 draws from the region of the catch pan 432 that is representative of the fluid level measured by the level sensor 440.

In the illustrated embodiment of FIG. 4, the level sensor 440 is located at a first end of the catch pan 432 and the second fluid pump 430-2 draws from the first end. In some embodiments, the catch pan 432 has a sloped bottom surface that slopes toward the first end, such that leaked working fluid 436 flows toward the first end, pooling the leaked working fluid 436 at or near the level sensor 440 and an intake conduit 444 of the second fluid pump 430-2 to more efficiently return the leaked working fluid 436 to the fluid reservoir 428. As described above, all components of the immersion cooling system illustrated in FIG. 4 are positioned above the catch pan 432, allowing leaked working fluid 436 that is leaked from anywhere in the immersion cooling system 400 (e.g., housing 426, fluid reservoir 428, condenser 406 or heat exchanger, or other fluid conduits) will collect in the catch pan 432 to be detected by the level sensor 440, filtered by the filter 442, and returned to the fluid reservoir 428 by the second fluid pump 430-2.

As described herein, by opening at least a portion of the working fluid circulation system, such as a catch pan 432 or fluid reservoir 428, to ambient atmosphere (inside the tank 402 or outside the tank 402), an immersion cooling system 400 according to the present disclosure may limit and/or prevent the water hammer effect. In some embodiments, a vent is positioned in the fluid reservoir 428 to allow the working fluid circulation system to vent to ambient air in the tank 402. In some embodiments, a vent 445 is positioned in a wall of the tank 402 to allow the interior volume of the tank 402 to vent to atmosphere. In some embodiments, the vent 445 is positioned in a top surface or lid of the tank 402 to allow the interior volume of the tank 402 to vent to atmosphere. In some embodiments, the tank 402 is open across substantially all of the top surface (i.e., a lid is removed) to allow the interior volume of the tank 402 to vent to atmosphere.

Because the immersion cooling system 400 may draw liquid working fluid 408 from the catch pan 432, in some embodiments, the fluid reservoir 428 may have a reservoir volume that is greater than the total volume of the initial liquid working fluid 408 and the volume of the housing 426. For example, a conventional system may have a fluid reservoir with a volume that substantially matches the volume of the conduits, housing, condenser, etc. to hold a volume of liquid working fluid 408 needed to fill the conduits, housing, condenser, etc. In some embodiments according to the present disclosure, additional liquid working fluid 408 may be introduced to the fluid reservoir 428 from the catch pan 432. Therefore, a fluid reservoir 428 may have a volume that is greater than or equal to the initial volume of liquid working fluid 408 in the system and the volume of the housing 426 to accommodate additional liquid working fluid 408 introduced to the system.

Figure 5:
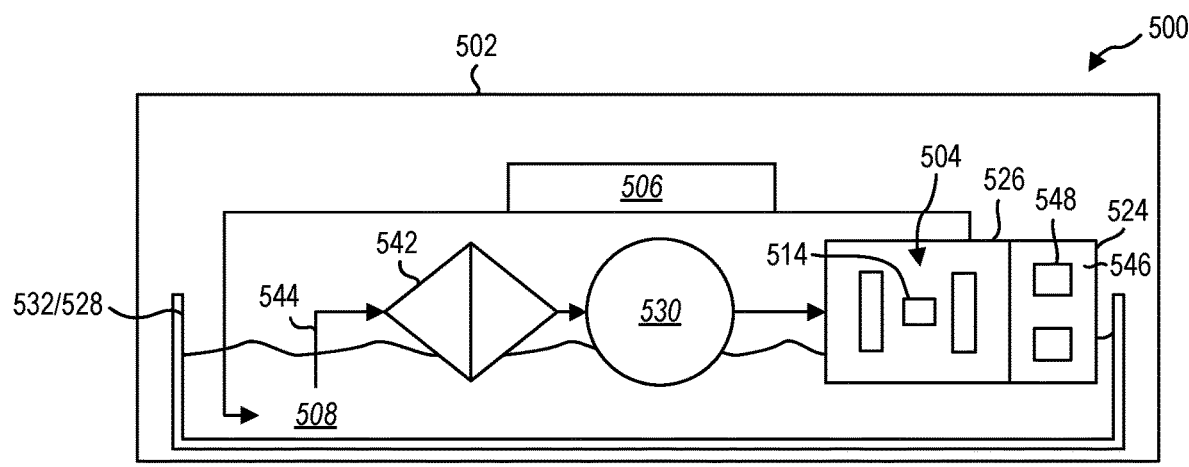
FIG. 5 is a side schematic representation of an immersion cooling system where a catch pan is a fluid reservoir, according to at least one embodiment of the present disclosure.

In some embodiments, the catch pan 432 may be the fluid reservoir 428. FIG. 5 is a schematic representation of another embodiment of an immersion cooling system 500. The immersion cooling system 500 includes a housing 526 with heat-generating components 514 therein and a liquid working fluid 508 that is circulated through the housing 526. A fluid pump 530 moves the liquid working fluid 508 from the catch pan 532/fluid reservoir 528 via an intake conduit 544. The liquid working fluid 508 may be filtered in a filter 542 before being pumped into the housing 526 to cool the heat-generating components 514.

The immersion cooling system 500 may be a two-phase cooling system or a single-phase cooling system. For example, the two-phase cooling system may include a condenser 506 that condenses a vapor working fluid from the housing 526 back into a liquid working fluid 508, which is returned to the catch pan 532/fluid reservoir 528. In other examples, the single-phase version of the immersion cooling system 500 may use a heat exchanger to cool the liquid working fluid 508 before the liquid working fluid 508 is returned to the catch pan 532/fluid reservoir 528. In yet other examples, a single-phase immersion cooling system may lack a condenser or heat-exchanger, and the relatively large surface area of the catch pan 532/fluid reservoir 528 may function as the heat exchanger to reject heat from the liquid working fluid 508 to the environment.

Some embodiments of the immersion cooling system 500 include a filter 542 to filter the liquid working fluid 508 because the open catch pan 532/fluid reservoir 528 may allow contaminants to enter the liquid working fluid 508. In some embodiments, the tank 502 of the immersion cooling system 500 may be sealed to prevent water vapor from entering the tank 502 and introducing condensation into the liquid working fluid 508 of the open catch pan 532/fluid reservoir 528.

In some embodiments, the housing 526 does not entirely encase the server computer 524. The server computer 524 may have a plurality of heat-generating electronic components 514 affixed to a substrate 546, such as a motherboard. Some electronic components may consume more power and/or generate more heat than other components. The greatest heat-generating components 514 of the server computer 524 may be immersed in liquid working fluid 508, while lesser heat-generating components 548 may be cooled through ambient gas convection cooling (e.g., a fan blowing on the lesser heat-generating components 548) or through overflow liquid working fluid 508 flowing from the immersion chamber 504 defined by the housing 526.

In some embodiments, removing at least a portion of the server computers or other electronic devices from the immersion bath or collection bath can maintain a cleaner, and, therefore, more efficient, working fluid. For example, the elastomers found in electronic connectors, wires, cables, or other components can leach into the liquid working fluid more readily than into the vapor working fluid. The leached elastomers can adversely affect the thermal absorption efficiency of the working fluid, adversely affect the viscosity of the working fluid, adversely affect the boiling temperature of the working fluid, or cause the working fluid to leave a deposit on the heat-generating components, which can adversely affect the thermal transfer (e.g., cooling) from the heat-generating components.

In some embodiments, data connectivity may be improved by positioning the connectors of the server computer in a gaseous environment relative to a liquid environment. For example, optical connections, such as fiber optics, may perform better and/or more predictably in a gaseous environment relative to a liquid environment due to differences in the index of refraction between the optical fibers and the liquid environment.

Placing the fluid reservoir 528 (i.e., the catch pan 532) at the bottom of the immersion cooling system 500 may allow the liquid working fluid 508 condensed by the condenser 506 to be returned to the fluid reservoir 528 more efficiency and/or while using less energy. Because the liquid working fluid 508 is denser than the ambient gases in the tank 502, the liquid working fluid 508 will preferentially flow from the condenser 506 downward to the fluid reservoir 528.

The incoming liquid working fluid is delivered by, in some embodiments, a manifold that directs the incoming liquid working fluid into the immersion chamber. In some embodiments, the incoming liquid working fluid is introduced through the opening in the top surface of the immersion chamber. In some embodiments, the incoming liquid working fluid is introduced through a port in housing, such as in the lateral wall of the immersion chamber. The incoming liquid working fluid may displace the liquid working fluid in the immersion chamber, at least partially, out an outlet in the housing to circulate the working fluid.

Figure 6:
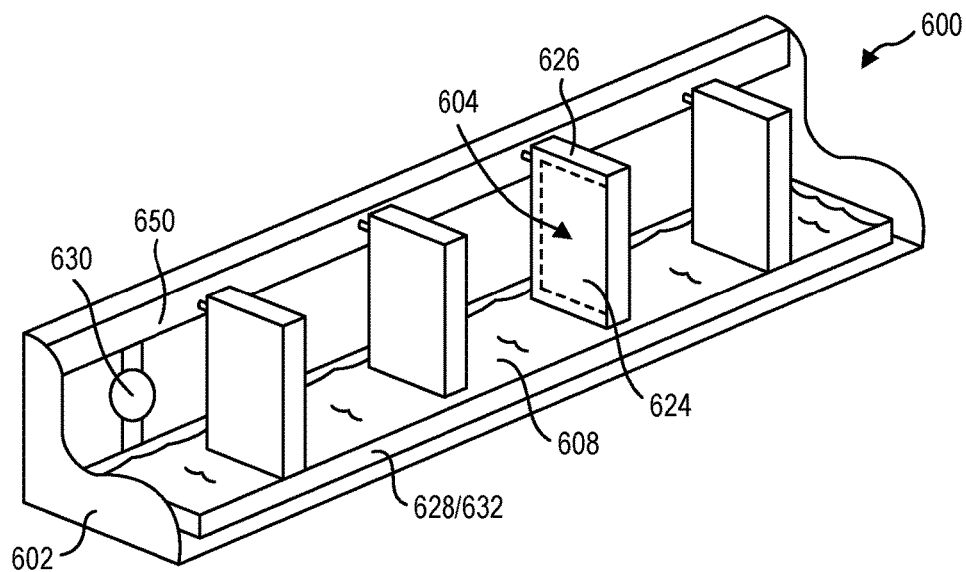
FIG. 6 is a perspective cutaway view of an immersion cooling system with a plurality of housings above a catch pan.

FIG. 6 is a perspective view of an immersion cooling system 600 illustrating a plurality of server computers 624 and housings 626 in a row. The manifold 650 may provide incoming liquid working fluid 608 to each of the housings 626 and immersion chambers 604, individually. The individual immersion chamber 604 for each server computer 624 is a more efficient allocation of liquid working fluid 608 while also providing modularity in the immersion cooling system 600 for maintenance and repairs. While the immersion cooling system 600 may include a condenser and return line(s) to return working fluid from the housing(s) 626 to the fluid reservoir 628/catch pan 632, the condenser and liquid return line(s) are not shown in FIG. 6 due to cutaway view.

At least two of the housings 626 are positioned above the fluid reservoir 628/catch pan 632. The row of housings 626 can, thereby, share a fluid reservoir 628/catch pan 632, such that leaked working fluid from any one of the housings 626 will fall into the fluid reservoir 628/catch pan 632 and be reintroduced into the manifold 650 to allow recirculation of the working fluid through all of the housings 626 connected to the manifold 650. In some embodiments, a fluid pump 630 draws liquid working fluid 608 from the fluid reservoir 628/catch pan 632 and delivers the liquid working fluid 608 to the manifold 650. In some embodiments, a plurality of fluid pumps 630 draw liquid working fluid 608 from the fluid reservoir 628/catch pan 632 and deliver the liquid working fluid 608 to the manifold 650. In at least one embodiment, the immersion cooling system 600 has a fluid pump 630 for each of the housings 626.

INDUSTRIAL APPLICABILITY

The present disclosure relates generally to systems and methods for thermal management of electronic devices or other heat-generating components Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The condenser condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system.

A conventional immersion cooling system includes an immersion tank containing an immersion chamber and a condenser in the immersion chamber. The immersion chamber contains a working fluid that has a liquid working fluid and a vapor working fluid portion. The liquid working fluid creates an immersion bath in which a plurality of heat-generating components is positioned to heat the liquid working fluid on supports.

In some embodiments, an immersion cooling system includes an immersion tank including an immersion chamber with a working fluid positioned therein. The working fluid transitions between a liquid working fluid phase and a vapor working fluid phase to remove heat from hot or heat-generating components in the immersion chamber. The liquid working fluid more efficiency receives heat from the heat-generating components and, upon transition to the vapor working fluid, the vapor working fluid can be removed from the immersion tank, cooled and condensed by the condenser to extract the heat from the working fluid, and the liquid working fluid can be returned to the liquid immersion bath.

In some embodiments, the immersion bath of the liquid working fluid has a plurality of heat-generating components positioned in the liquid working fluid. The liquid working fluid surrounds at least a portion of the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the liquid working fluid may remove heat through convective cooling.

In some embodiments, the heat-generating components include electronic or computing components or power supplies. In some embodiments, the heat-generating components include computer devices, such as individual personal computer or server blade computers. In some embodiments, one or more of the heat-generating components includes a heat sink or other device attached to the heat-generating component to conduct away thermal energy and effectively increase the surface area of the heat-generating component. In some embodiments, the heat-generating components include an electric motor.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor working fluid rises in the liquid working fluid, the vapor working fluid can be extracted from the immersion chamber in an upper vapor region of the chamber. A condenser cools part of the vapor working fluid back into a liquid working fluid, removing thermal energy from the system, and reintroducing the working fluid into the immersion bath of the liquid working fluid. The condenser radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system for thermal management of computing devices allows at least one immersion tank and/or chamber to be connected to and in fluid communication with an external condenser. In some embodiments, an immersion cooling system includes a vapor return line that connects the immersion tank to the condenser and allows vapor working fluid to enter the condenser from the immersion tank and/or chamber and a liquid return line that connects the immersion tank to the condenser and allows liquid working fluid to return to the immersion tank and/or chamber.

The vapor return line may be colder than the boiling temperature of the working fluid. In some embodiments, a portion of the vapor working fluid condenses in the vapor return line. The vapor return line can, in some embodiments, be oriented at an angle such that the vapor return line is non-perpendicular to the direction of gravity. The condensed working fluid can then drain either back to the immersion tank or forward to the condenser depending on the direction of the vapor return line slope. In some embodiments, the vapor return line includes a liquid collection line or valve, like a bleeder valve, that allows the collection and/or return of the condensed working fluid to the immersion tank or condenser.

In some examples, an immersion cooling system includes an air-cooled condenser. An air-cooled condenser may require fans or pumps to force ambient air over one or more heat pipes or fins to conduct heat from the condenser to the air.

In some embodiments, an immersion cooling system includes localized immersion chambers around a server computer to capture and pool liquid working fluid adjacent the greatest heat-generating components. Working fluid is recycled through the thermal management system, and, in some embodiments, the working fluid is a dielectric fluid or other fluid that is expensive. A thermal management system that uses less working fluid and/or uses the working fluid more efficiently allows for cost savings in the working fluid. In some embodiments, the working fluid is relatively dense and containing large volumes of the working fluid requires a strong container. Building and maintaining containers for large volumes and/or masses of working fluid can increase construction costs and container weight, which limits transport and maintenance of the containers.

In a conventional immersion tank, the liquid pressure increases as depth of the immersion bath increases. In conventional tanks and fluids, a depth of 1 meter results in a 2.3 pounds per square inch (PSI) increase. The increased pressure results in an increase in the boiling point for the working fluid and a resulting temperature increase of the components adjacent the working fluid at the bottom of the immersion bath. When separate immersion chambers are placed around heat-generating components, and/or the boards are oriented horizontally, the columnar pressure of the fluid around the component is reduced and produces lower operating temperatures for the component. In at least one example, a working fluid exhibits a 4° C. decrease in temperature relative to a component at a depth of 1 meter in a conventional immersion tank.

In some embodiments according to the present disclosure, a housing is positioned around or on a server computer or other electronic device to capture the liquid working fluid adjacent to at least one heat-generating component of the server computer in an immersion chamber. In some embodiments, the housing includes a stamped metal or polymer sheet. In some embodiments, the housing includes an injection molded sheet. The housing may have planar or curved surfaces to define a portion of the immersion chamber. In some embodiments, the housing defines a portion of a rectangular prism or box-shaped immersion chamber around the heat-generating electronic components. In some embodiments, at least a portion of the housing is contoured to follow the shape of the heat-generating electronic components.

The housing allows for the immersion cooling system to use less working fluid than a conventional immersion cooling system in which the entire tank is filled with working fluid into which the heat-generating components are immersed. The housing contains the liquid working fluid around the heat-generating components, and, when the liquid working fluid vaporizes, the vapor working fluid passes through a vapor return line to the condenser. In single-phase cooling systems, the condenser may be a heat exchanger or radiator to cool hot liquid working fluid cycled out of the housing.

The liquid working fluid is stored in a fluid reservoir from which a fluid pump may draw or push the liquid working fluid to the immersion chamber contained in the housing. In some embodiments, a portion of the liquid working fluid may leak from the housing, fluid reservoir, or other fluid conduits of the thermal management system. In some embodiments, a portion of the liquid working fluid may leak from the housing, fluid reservoir, or other fluid conduits of the thermal management system as incoming liquid working fluid flows into the immersion chamber from the pump. In some embodiments, a portion of the liquid working fluid may leak from the housing, fluid reservoir, or other fluid conduits of the thermal management system as the vapor working fluid returns from the immersion chamber. In conventional thermal management systems, a catch pan is positioned under the housing, fluid reservoir, condenser (or heat exchanger) or other fluid conduits of the thermal management system to capture the leaked working fluid. A leak sensor may indicate to a technician when a leak has occurred.

The leaked working fluid is lost to the system, and, in the case of persistent leak, the housing, fluid reservoir, condenser (or heat exchanger) or other fluid conduits of the thermal management system may substantially empty of working fluid, preventing effective thermal management of the server computer or other heat-generating components. In some examples, a portion of the working fluid is lost to the system, and the air in the housing, fluid reservoir, condenser (or heat exchanger) or other fluid conduits of the thermal management system may cause intermittent delivery of liquid working fluid, resulting in a water hammer effect that may damage the server computer or other heat-generating components.

In some examples, an immersion cooling system allows at least a portion of the leaked working fluid to be reintroduced to the fluid reservoir or other portions of the immersion cooling system to extend the effective cooling capability of the immersion cooling system. By reintroducing the leaked working fluid to the system, technicians may have more time to respond to a leak before the immersion cooling system runs dry and the heat-generating components lack thermal management.

In some embodiments, any or all of the fluid reservoir, condenser, fluid pump, housing, and fluid conduits therebetween are positioned above the catch pan. In some embodiments, a component of the immersion cooling system is positioned above the catch pan when the entire component or a drip point of the component is located above the catch pan in the direction of gravity. For example, a housing (or other component) is positioned above the catch pan when the entire housing is located above the catch pan such that any leaked working fluid that drips from any portion of the housing falls directly into the catch pan under the influence of gravity.

In some examples, a housing (or other component) is positioned above the catch pan when a drip point of the housing is above the catch pan such that any leaked working fluid that leaks from the housing is guided, such as by cohesion, to the drip point and, subsequently, falls directly into the catch pan under the influence of gravity. A single catch pan may be located under all of the other components of the immersion cooling system; however, it should be understood that multiple catch pans may be used to catch leaks from any number of components of the immersion cooling system.

The catch pan may include a level sensor that includes a pressure or electrical contact that determines when leaked working fluid is present in the catch pan. The level sensor can determine a fluid level of the leaked working fluid and communicate with one or more components of the immersion cooling system or other systems. For example, the level sensor may be in electrical or data communication with a second fluid pump. In response to the level sensor detecting the presence of leaked working fluid at a high enough level in the catch pan, the second fluid pump may pump the leaked working fluid to the fluid reservoir. In some embodiments, a fluid filter may be positioned before and/or after the second fluid pump to clean the leaked working fluid before the leaked working fluid returns to the fluid reservoir and mixes with the liquid working fluid therein. In some embodiments, the second fluid pump draws the leaked working fluid from the catch pan proximate the level sensor, such that the second fluid pump draws from the region of the catch pan that is representative of the fluid level measured by the level sensor.

In some embodiments, the level sensor is located at a first end of the catch pan and the second fluid pump draws from the first end. In some embodiments, the catch pan has a sloped bottom surface that slopes toward the first end, such that leaked working fluid flows toward the first end, pooling the leaked working fluid at or near the level sensor and an intake conduit of the second fluid pump to more efficiently return the leaked working fluid to the fluid reservoir. As described above, all components of the immersion cooling system may be positioned above the catch pan, allowing leaked working fluid that is leaked from anywhere in the immersion cooling system (e.g., housing, fluid reservoir, condenser or heat exchanger, or other fluid conduits) will collect in the catch pan to be detected by the level sensor, filtered by the filter, and returned to the fluid reservoir by the second fluid pump.

Because the immersion cooling system may draw liquid working fluid from the catch pan, in some embodiments, the fluid reservoir may have a reservoir volume that is greater than the total volume of the initial liquid working fluid and the volume of the housing. For example, a conventional system may have a fluid reservoir with a volume that substantially matches the volume of the conduits, housing, condenser, etc. to hold a volume of liquid working fluid needed to fill the conduits, housing, condenser, etc. In some embodiments according to the present disclosure, additional liquid working fluid may be introduced to the fluid reservoir from the catch pan. Therefore, a fluid reservoir may have a volume that is greater than or equal to the initial volume of liquid working fluid in the system and the volume of the housing to accommodate additional liquid working fluid introduced to the system.

In some embodiments, the catch pan may be the fluid reservoir. For example, the immersion cooling system may include a housing with heat-generating components therein and a liquid working fluid that is circulated through the housing. A fluid pump moves the liquid working fluid from the catch pan/fluid reservoir via an intake conduit. The liquid working fluid may be filtered in a filter before being pumped into the housing to cool the heat-generating components.

The immersion cooling system may be a two-phase cooling system or a single-phase cooling system. For example, the two-phase cooling system may include a condenser that condenses a vapor working fluid from the housing back into a liquid working fluid, which is returned to the catch pan/fluid reservoir. In other examples, the single-phase version of the immersion cooling system may use a heat exchanger to cool the liquid working fluid before the liquid working fluid is returned to the catch pan/fluid reservoir. In yet other example, a single-phase immersion cooling system may lack a condenser or heat-exchanger, and the relatively large surface area of the catch pan/fluid reservoir may function as the heat exchanger to reject heat from the liquid working fluid to the environment.

Some embodiments of the immersion cooling system include a filter to filter the liquid working fluid because the open catch pan/fluid reservoir may allow contaminants to enter the liquid working fluid. In some embodiments, the tank of the immersion cooling system may be sealed to prevent water vapor from entering the tank and introducing condensation into the liquid working fluid of the open catch pan/fluid reservoir.

In some embodiments, the housing does not entirely encase the server computer. The server computer may have a plurality of heat-generating electronic components affixed to a substrate, such as a motherboard. Some electronic components may consume more power and/or generate more heat than other components. The greatest heat-generating components of the server computer may be immersed in liquid working fluid, while lesser heat-generating components may be cooled through ambient gas convection cooling (e.g., a fan blowing on the lesser heat-generating components) or through overflow liquid working fluid flowing from the immersion chamber defined by the housing.

In some embodiments, removing at least a portion of the server computers or other electronic devices from the immersion bath or collection bath can maintain a cleaner, and, therefore, more efficient, working fluid. For example, the elastomers found in electronic connectors, wires, cables, or other components can leach into the liquid working fluid more readily than into the vapor working fluid. The leached elastomers can adversely affect the thermal absorption efficiency of the working fluid, adversely affect the viscosity of the working fluid, adversely affect the boiling temperature of the working fluid, or cause the working fluid to leave a deposit on the heat-generating components, which can adversely affect the thermal transfer (e.g., cooling) from the heat-generating components.

In some embodiments, data connectivity may be improved by positioning the connectors of the server computer in a gaseous environment relative to a liquid environment. For example, optical connections, such as fiber optics, may perform better and/or more predictably in a gaseous environment relative to a liquid environment due to differences in the index of refraction between the optical fibers and the liquid environment.

Placing the fluid reservoir (i.e., the catch pan) at the bottom of the immersion cooling system may allow the liquid working fluid condensed by the condenser to be returned to the fluid reservoir more efficiency and/or while using less energy. Because the liquid working fluid is denser than the ambient gases in the tank, the liquid working fluid will preferentially flow from the condenser downward to the fluid reservoir.

The incoming liquid working fluid is delivered by, in some embodiments, a manifold that directs the incoming liquid working fluid into the immersion chamber. In some embodiments, the incoming liquid working fluid is introduced through the opening in the top surface of the immersion chamber. In some embodiments, the incoming liquid working fluid is introduced through a port in housing, such as in the lateral wall of the immersion chamber. The incoming liquid working fluid may displace the liquid working fluid in the immersion chamber, at least partially, out an outlet in the housing to circulate the working fluid.

The manifold may provide incoming liquid working fluid to each of the housings and immersion chambers, individually. The individual immersion chamber for each server computer is a more efficient allocation of liquid working fluid while also providing modularity in the immersion cooling system for maintenance and repairs.

At least two of the housings may be positioned above the fluid reservoir/catch pan. The row of housings can, thereby, share a fluid reservoir/catch pan, such that leaked working fluid from any one of the housings will fall into the fluid reservoir/catch pan and be reintroduced into the manifold to allow recirculation of the working fluid through all of the housings connected to the manifold. In some embodiments, a fluid pump draws liquid working fluid from the fluid reservoir/catch pan and delivers the liquid working fluid to the manifold. In some embodiments, a plurality of fluid pumps draw liquid working fluid from the fluid reservoir/catch pan and deliver the liquid working fluid to the manifold. In at least one embodiment, the immersion cooling system has a fluid pump for each of the housings.

The present disclosure relates to systems and methods for cooling heat-generating components of a computer or computing device according to at least the examples provided in the sections below:

[A1] In some embodiments, an immersion cooling system includes a catch pan, a heat-generating electronic device, a housing, and a fluid pump. The housing is positioned around the heat-generating electronic device, and at least part of the housing is positioned above the catch pan. The fluid pump is configured to circulate a working fluid from the catch pan to the housing.

[A2] In some embodiments, the fluid pump of [A1] is positioned above the catch pan.

[A3] In some embodiments, the immersion cooling system of [A1] or [A2] further includes a cooling conduit providing fluid communication from the fluid pump to the housing, and the cooling conduit is positioned above the catch pan.

[A4] In some embodiments, the immersion cooling system of any of [A1] through [A3] further includes a heat exchanger positioned above the catch pan.

[A5] In some embodiments, the heat exchanger of [A4] is a condenser.

[A6] In some embodiments, the immersion cooling system of [A5] further includes return conduit providing fluid communication from the housing to the condenser, and the return conduit is positioned above the catch pan.

[A7] In some embodiments, the immersion cooling system of any of [A1] through [A6] further includes a filter configured to filter contaminants from the working fluid.

[A8] In some embodiments, the filter of [A7] is positioned between an intake conduit and the fluid pump and configured to filter contaminants from the working fluid between the catch pan and the fluid pump.

[A9] In some embodiments, the immersion cooling system of any of [A1] through [A8] is open to ambient atmosphere outside of a tank.

[A10] In some embodiments, the tank of [A9] is fully open on a top surface.

[A11] In some embodiments, the immersion cooling system of any of [A1] through [A10] further includes a fluid reservoir, and the fluid pump is configured to pump working fluid from the catch pan to the fluid reservoir.

[A12] In some embodiments, the heat-generating electronic device of any of [A1] through [A11] is part of a computer that also includes at least one lesser heat-generating components, and the housing is positioned around the heat-generating electronic device and not the lesser heat-generating component.

[B1] In some embodiments, an immersion cooling system includes a catch pan, a heat-generating electronic device, a housing, a fluid reservoir, and a fluid pump. The housing is positioned around the heat-generating electronic device, and at least part of the housing is positioned above the catch pan. The fluid reservoir is in fluid communication with the housing and configured to provide working fluid to the housing. The fluid pump is configured to circulate the working fluid from the catch pan to the fluid reservoir.

[B2] In some embodiments, the immersion cooling system of [B1] includes a second fluid pump configured to pump working fluid from fluid reservoir to the housing.

[B3] In some embodiments, the immersion cooling system of [B1] or [B2] includes a level sensor in data communication with the fluid pump, and the level sensor is configured to measure a fluid level in the catch pan.

[B4] In some embodiments, the catch pan of any of [B1] through [B3] is a first catch pan and the immersion cooling system includes a second catch pan, and the fluid reservoir receives working fluid from both the first catch pan and second catch pan.

[B5] In some embodiments, the housing of any of [B1] through [B4] is a first housing and the immersion cooling system includes a second housing. The fluid reservoir is in fluid communication with both the first housing and second housing and configured to provide working fluid to the first housing and second housing.

[B6] In some embodiments, a volume of the fluid reservoir of any of [B1] through [B5] is greater than a total volume of a liquid phase of the working fluid and an internal volume of the housing.

[C1] In some embodiments, an immersion cooling system includes a catch pan, a heat-generating electronic device, a housing, a fluid reservoir, a fluid pump, and a level sensor. The housing is positioned around the heat-generating electronic device, and at least part of the housing is positioned above the catch pan. The fluid reservoir is in fluid communication with the housing and configured to provide working fluid to the housing. The fluid pump is configured to circulate the working fluid from the catch pan to the fluid reservoir. The level sensor is positioned in the catch pan and in data communication with the fluid pump.

[C2] In some embodiments, the level sensor and an intake of the fluid pump of [C1] are positioned proximate a first end of the catch pan, and a bottom surface of the catch pan is sloped to direct working fluid to the first end.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An immersion cooling system comprising:
a catch pan;
a heat-generating electronic device;
a housing positioned around the heat-generating electronic device such that the heat-generating electronic device is at least partially enclosed within the housing, wherein an exterior of the housing defines an angled projection that extends from a bottom surface of the housing to form a drip point structure positioned above the catch pan and wherein the exterior of the housing is configured to guide leaking working fluid from the housing, along the exterior of the housing through cohesion to the drip point structure to drip from the drip point structure and fall directly into the catch pan;
a fluid reservoir in fluid communication with the housing and configured to provide a working fluid to the housing; and
a fluid pump configured to circulate the working fluid from the catch pan to the housing.

2. The system of claim 1, wherein the fluid pump is positioned above the catch pan.

3. The system of claim 1, further comprising a cooling conduit providing fluid communication from the fluid pump to the housing, wherein the cooling conduit is positioned above the catch pan.

4. The system of claim 1, further comprising a heat exchanger positioned above the catch pan.

5. The system of claim 4, wherein the heat exchanger is a condenser.

6. The system of claim 5, further comprising a return conduit providing fluid communication from the housing to the condenser, wherein the return conduit is positioned above the catch pan.

7. The system of claim 1, further comprising a filter configured to filter contaminants from the working fluid.

8. The system of claim 7, wherein the filter is positioned between an intake conduit and the fluid pump and configured to filter contaminants from the working fluid between the catch pan and the fluid pump.

9. The system of claim 1, wherein the fluid pump is configured to pump the working fluid from the catch pan to the fluid reservoir.

10. The system of claim 1, wherein the heat-generating electronic device is part of a computer that also includes at least one lesser heat-generating components, and the housing is positioned around the heat-generating electronic device and not the lesser heat-generating component.

11. An immersion cooling system comprising:
a catch pan;
a heat-generating electronic device;
a housing positioned around the heat-generating electronic device such that the heat-generating electronic device is at least partially enclosed within the housing, wherein a first part of the housing is not positioned above the catch pan and wherein an exterior of the housing defines an angled projection that extends from a bottom surface of the housing to form a drip point structure positioned above the catch pan, the exterior of the housing being configured to guide leaking working fluid from the first part of the housing to the drip point structure to drip from the drip point structure and fall directly into the catch pan;
a fluid reservoir in fluid communication with the housing and configured to provide working fluid to the housing; and
a fluid pump configured to circulate the working fluid from the catch pan to the fluid reservoir.

12. The system of claim 11, further comprising a second fluid pump configured to pump the working fluid from the fluid reservoir to the housing.

13. The system of claim 11, further comprising a level sensor in data communication with the fluid pump, wherein the level sensor is configured to measure a fluid level in the catch pan.

14. The system of claim 11, wherein the catch pan is a first catch pan and further comprising a second catch pan, wherein the fluid reservoir receives working fluid from both the first catch pan and second catch pan.

15. The system of claim 11, wherein the housing is a first housing and further comprising a second housing, the fluid reservoir in fluid communication with both the first housing and second housing and configured to provide working fluid to the first housing and second housing.

16. The system of claim 11, wherein a volume of the fluid reservoir is greater than a total volume of a liquid phase of the working fluid and an internal volume of the housing.

17. A liquid cooling system comprising;
a tank including an interior volume, the tank further including:
a catch pan;
a heat-generating electronic device;
a housing positioned around the heat-generating electronic device such that the heat-generating electronic device is at least partially enclosed within the housing, wherein an exterior of the housing defines a tapered projection that extends from a bottom surface of the housing to form a drip point structure positioned above the catch pan and wherein the exterior of the housing is configured to guide leaking working fluid from the housing, along the exterior of the housing through cohesion to the drip point structure to drip from the drip point structure and fall through free space directly into the catch pan;
a fluid reservoir in fluid communication with the housing and configured to provide working fluid to the housing;
a fluid pump configured to circulate the working fluid from the catch pan to the fluid reservoir;
a vent positioned in a top surface of the tank, configured to allow the interior volume of the tank to vent to atmosphere; and
a level sensor positioned in the catch pan and in data communication with the fluid pump, wherein the level sensor and an intake of the fluid pump are positioned proximate a first end of the catch pan, and a bottom surface of the catch pan is sloped to direct the working fluid to the first end.

18. The immersion cooling system of claim 11, further comprising a return conduit providing fluid communication from the housing to a condenser for condensing a vapor portion of the working fluid, wherein the condenser includes a second drip point positioned above the catch pan to guide leaking working fluid from the condenser through cohesion to the second drip point and to drip from the second drip point directly into the catch pan.

19. The immersion cooling system of claim 18, wherein a first part of the condenser is not positioned above the catch pan and a second portion of the condenser includes the second drip point positioned above the catch pan.

20. The liquid cooling system of claim 17, wherein the tank is fully open on a top surface.

* * * * *